(12) United States Patent
Kshirsagar et al.

(10) Patent No.: US 12,532,737 B2
(45) Date of Patent: Jan. 20, 2026

(54) SEMICONDUCTOR DEVICE PACKAGE THERMALLY COUPLED TO PASSIVE ELEMENT

(71) Applicant: Infineon Technologies AG, Neubiberg (DE)

(72) Inventors: Kushal Kshirsagar, Warwick, RI (US); Eung San Cho, Torrance, CA (US); Arun Kumar Gnanappa, Regensburg (DE); Wenkang Huang, East Greenwich, RI (US); Angela Kessler, Sinzing (DE); Marcel Rene Mueller, Bendorf (DE); Stephen Pullen, Olympia, WA (US)

(73) Assignee: Infineon Technologies AG, Neubiberg (DE)

( * ) Notice: Subject to any disclaimer, the term of this patent is extended or adjusted under 35 U.S.C. 154(b) by 505 days.

(21) Appl. No.: 17/742,666

(22) Filed: May 12, 2022

(65) Prior Publication Data

US 2023/0369160 A1    Nov. 16, 2023

(51) Int. Cl.
*H01L 23/367* (2006.01)
*H01L 21/48* (2006.01)
*H01L 23/00* (2006.01)
*H01L 23/498* (2006.01)

(52) U.S. Cl.
CPC ...... *H01L 23/3675* (2013.01); *H01L 21/4853* (2013.01); *H01L 21/4871* (2013.01); *H01L 23/49838* (2013.01); *H01L 24/16* (2013.01); *H01L 2224/16227* (2013.01); *H01L 2924/19042* (2013.01); *H01L 2924/19105* (2013.01)

(58) Field of Classification Search
None
See application file for complete search history.

(56) References Cited

U.S. PATENT DOCUMENTS

| | | | |
|---|---|---|---|
| 5,867,367 A | 2/1999 | Barrow | |
| 6,160,223 A | 12/2000 | Gates | |
| 9,640,474 B1 * | 5/2017 | Cho | ............ H01L 21/4821 |

(Continued)

FOREIGN PATENT DOCUMENTS

| | | |
|---|---|---|
| EP | 1942574 A1 | 7/2008 |
| JP | 2010045111 A | 2/2010 |

*Primary Examiner* — Long Pham
(74) *Attorney, Agent, or Firm* — Murphy, Bilak & Homiller, PLLC (57) ABSTRACT

A semiconductor assembly includes a device carrier that includes a dielectric core region and a plurality of contact pads disposed on an upper surface, a semiconductor device package having a plurality of lower surface terminals, a discrete passive element comprising a main body and a pair of leads, and a region of gap filler material, wherein the semiconductor device package is mounted on the device carrier with the lower surface terminals facing and electrically connected to a group of the contact pads, wherein the discrete passive element is mounted on the device carrier with the pair of leads electrically connecting with contact surfaces on the device carrier, and wherein the region of gap filler material is arranged between a lower surface of the main body and the upper surface of the semiconductor device package and thermally couples the semiconductor device package to the discrete passive element.

9 Claims, 8 Drawing Sheets

(56) References Cited

U.S. PATENT DOCUMENTS

| | | | |
|---|---|---|---|
| 11,848,262 B2* | 12/2023 | Kessler | H01L 23/49844 |
| 2003/0141600 A1 | 7/2003 | Van | |
| 2007/0075815 A1 | 4/2007 | Lotfi et al. | |
| 2008/0272483 A1 | 11/2008 | Oman | |
| 2010/0085139 A1 | 4/2010 | Yan et al. | |
| 2011/0053319 A1 | 3/2011 | Hohlfeld et al. | |
| 2014/0245598 A1 | 9/2014 | Herbsommer et al. | |
| 2017/0148705 A1 | 5/2017 | Cho | |
| 2018/0054119 A1 | 2/2018 | Cho et al. | |
| 2018/0182532 A1 | 6/2018 | Stahr et al. | |
| 2018/0190573 A1* | 7/2018 | Mullenix | H01F 27/306 |
| 2018/0270957 A1 | 9/2018 | Swaminathan et al. | |
| 2020/0161274 A1 | 5/2020 | Lee | |
| 2020/0245465 A1 | 7/2020 | Zhang et al. | |
| 2021/0105898 A1 | 4/2021 | Chiang et al. | |
| 2021/0307173 A1 | 9/2021 | Lenhardt et al. | |
| 2022/0037280 A1 | 2/2022 | Tang et al. | |
| 2023/0371165 A1 | 11/2023 | Deboy et al. | |
| 2024/0213205 A1* | 6/2024 | Kang | H01L 24/73 |
| 2024/0304603 A1* | 9/2024 | Zhou | H01L 24/11 |

* cited by examiner

SEMICONDUCTOR DEVICE PACKAGE THERMALLY COUPLED TO PASSIVE ELEMENT

BACKGROUND

Power modules are used an many applications such as automotive and industrial applications. A power module may include power devices that are rated to control large voltages and/or currents, e.g., MOSFETs (metal oxide semiconductor field effect transistors), IGBTs (insulated gate bipolar transistors), diodes, etc., and driver devices that are configured to control the power devices. A power module may also include passive electric elements, e.g., inductors, capacitors, etc., that enhance performance, e.g., power efficiency, switching speed, etc. It is desirable to provide a power module with high performance, e.g., high peak efficiency and a high load efficiency, while maintaining a small areal footprint and having robust electrical interconnections.

SUMMARY

A semiconductor assembly is disclosed. According to an embodiment, the semiconductor assembly comprises a device carrier that comprises a dielectric core region and a plurality of contact pads disposed on an upper surface of the device carrier, a semiconductor device package comprising a plurality of lower surface terminals, a discrete passive element comprising a main body and a pair of leads exposed from the main body, and a region of gap filler material, wherein the semiconductor device package is mounted on the device carrier with the lower surface terminals facing and electrically connected to a group of the contact pads, wherein the discrete passive element is mounted on the device carrier with the pair of leads electrically connecting with contact surfaces on the device carrier, and wherein the region of gap filler material is arranged between a lower surface of the main body and the upper surface of the semiconductor device package and thermally couples the semiconductor device package to the discrete passive element.

According to another embodiment, the semiconductor assembly comprises a device carrier that comprises a dielectric core region and a plurality of contact pads disposed on an upper surface of the device carrier, a semiconductor device package comprising a plurality of lower surface terminals, a discrete passive element comprising a main body and a pair of leads exposed from the main body, and wherein the discrete passive element is mounted over the semiconductor device package with a lower surface of the main body facing an upper surface of the semiconductor device package, wherein the device carrier comprises a pair of contact trenches that are arranged on opposite sides of the semiconductor device package, wherein the contact trenches comprise conductive contact surfaces on a bottom or sidewalls of the contact trenches, and wherein the leads of the discrete passive element conductively contact the contact surfaces of the contact trenches.

A method of forming a semiconductor assembly is disclosed. According to an embodiment, forming the semiconductor assembly comprises providing a device carrier that comprises a dielectric core region and a plurality of contact pads disposed on an upper surface of the device carrier, providing a semiconductor device package comprising a plurality of lower surface terminals, mounting the semiconductor device package on the device carrier with the lower surface terminals facing and electrically connected to a group of the contact pads, providing a discrete passive element comprising a main body and leads exposed from the main body, mounting the discrete passive element on the device carrier such that the leads electrically contact the device carrier and such that a lower surface of the main body faces an upper surface of the semiconductor device package, and providing a gap filler material in between the lower surface of the main body and the upper surface of the semiconductor device package such that the gap filler material thermally couples the semiconductor device package to the discrete passive element.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a semiconductor assembly comprising a semiconductor device package and a discrete passive element mounted on a device carrier with an advantageous thermal coupling arrangement between the semiconductor device package and the discrete passive element. The discrete passive element is mounted over the semiconductor device package with a main body of the discrete passive element facing an upper surface of the semiconductor device package. A region of thermally conductive gap filler material is provided between the main body of the discrete passive element and the upper surface of the semiconductor device, thereby thermally coupling these elements to one another. In addition to functioning as a circuit element connected with the semiconductor device package, the discrete passive element serves as a heat sink that dissipates heat away from the semiconductor device package during operation. According to an embodiment, the device carrier comprises contact trenches that receive leads from the discrete passive element and form electrical connections thereto. These contact trenches can be used in combination with a flowable adhesive material to provide a buffer that compensates for variation in geometric discrepancies of the elements from the assembly. This turn allows for a consistent standoff height of the discrete passive element and good thermal coupling between the discrete passive element and the semiconductor device package despite these geometric discrepancies.

Figure 1:
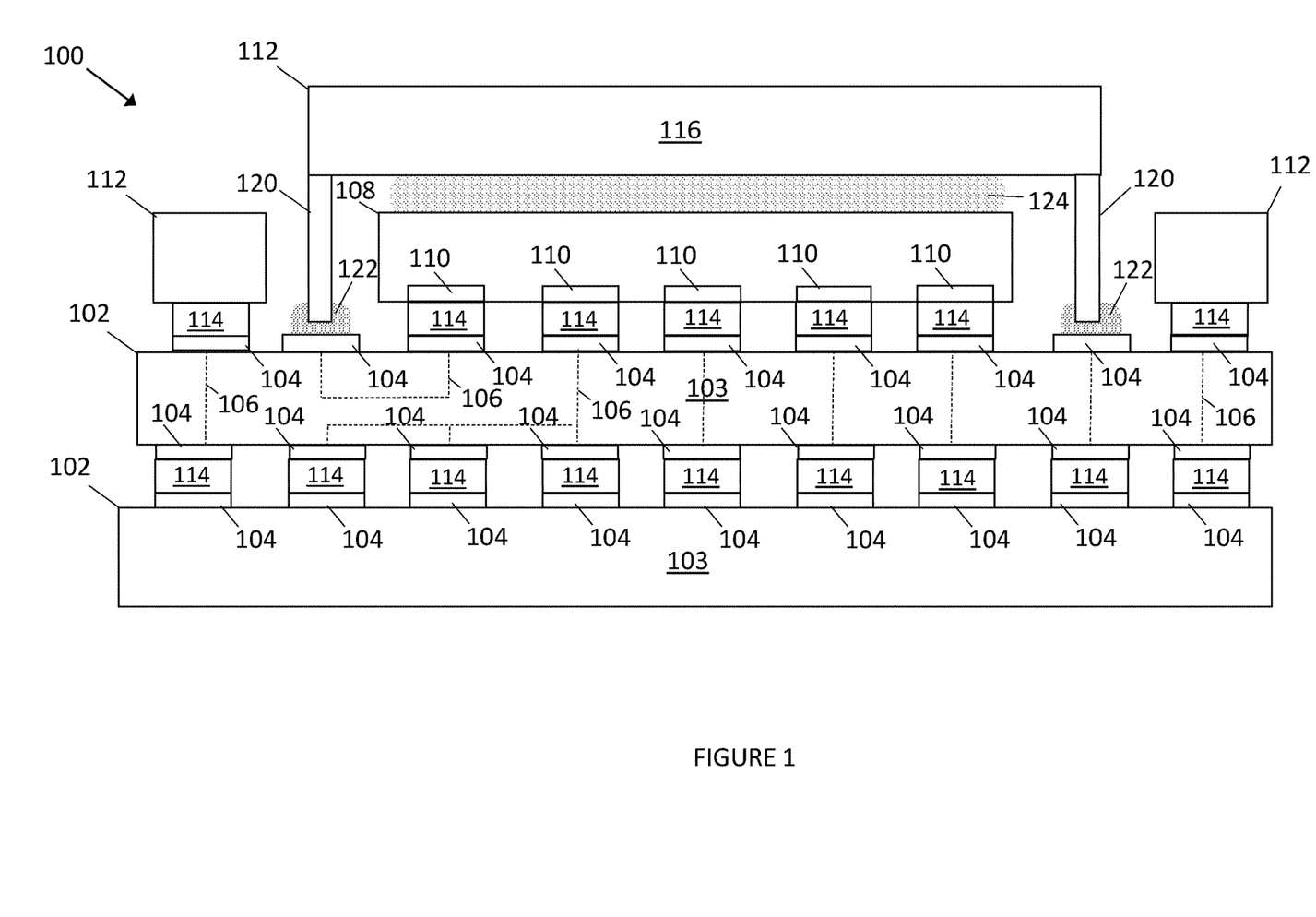
FIG. 1 illustrates a semiconductor assembly with a semiconductor device package and a discrete passive element mounted on a first device carrier that in turn is mounted on a second device carrier, according to an embodiment.

Referring to FIG. 1, the semiconductor assembly 100 is depicted, according to an embodiment. The semiconductor assembly 100 comprises a first device carrier 102 mounted on a second device carrier 102. The first and second device carriers 102 each comprise a dielectric core region 103 and a plurality of contact pads 104 disposed on an upper surface of the respective device carrier 102. The dielectric core region 103 can comprise electrically insulating materials such as ceramics, epoxy materials, plastics, glass materials, oxides, nitrides, pre-peg materials, etc. The first and second device carriers 102 can comprise conductive elements, e.g., conductive tracks, via structures, arranged within the dielectric core region 103. The contact pads 104 can be provided by a structured layer of metallization, e.g., a layer comprising copper, aluminium, zinc, tungsten, nickel, etc. alloys thereof, that is formed on or attached to the upper surface of the device carrier 102.

According to an embodiment, the first device carrier 102 is an interposer that is mounted on the second device carrier 102. This interposer is an electrical redistribution structure that is used to provide electrical interconnect between the components mounted on the interposer and the second device carrier 102 that the interposer is mounted on. This interposer may also provide interconnections between the electronic components mounted thereon. The first device carrier 102 that is configured as an interposer comprises lower contact pads 104 disposed on a lower surface of the first device carrier 102, and an internal network of interconnect lines 106 disposed between the upper and lower surfaces of the substrate 102. These interconnect lines 106 are schematically depicted in the figure. In practice, these interconnect lines 106 may be constructed from a network of conductive tracks within the dielectric core region 103. In one example, the first device carrier 102 that has a PCB-like construction wherein the dielectric core region 103 of the first device carrier 102 comprises a pre-peg material such as FR-4 with structured metallization layers providing the contact pads 104 and the internal network of interconnect lines 106. In another example, the first device carrier 102 can be constructed from a bulk semiconductor material such as silicon and the various electrical structures are formed using standard semiconductor processing techniques. The first device carrier 102 that is an interposer may be exclusively configured as a passive device that provides low-restive electrical interconnect. That is, the first device carrier 102 may be devoid of other electrical elements. Alternatively, the first device carrier 102 may be an interposer that comprises one or more active or passive electrical elements monolithically integrated therein. For example, passive electrical elements, e.g., resistors, capacitors, inductors, etc., can be formed in this interposer through intentional geometric structuring of the interconnect lines 106 and/vias. Additionally, or alternatively, the first device carrier 102 that is an interposer may comprise semiconductor devices such as diodes, transistors, etc. integrally formed therein.

The second device carrier 102 that is below the interposer can be any type of electronics carrier that is designed to accommodate the mounting of multiple electronics components thereon, such as a PCB (printed circuit board), DBC (direct bonded copper) substrate, AMB (active metal brazed) substrate, IMS (insulated metal substrate), etc. The second device carrier 102 may therefore comprise additional electronic components (not shown) mounted in other locations, e.g., semiconductor dies, passive elements, and further assemblies with an interposer structure.

The semiconductor assembly 100 further comprises a semiconductor device package 108 mounted on the first device carrier 102. The semiconductor device package 108 comprises one or more semiconductor dies embedded within a package body and a plurality of lower surface terminals 110 that are exposed from a package body at a lower surface of the semiconductor device package 108. The semiconductor device package 108 is mounted on the first device carrier 102 such that the lower surface terminals 110 of the semiconductor device package 108 electrically connect with a group of the contact pads 104 on the upper surface on the first device carrier 102. An electrical and mechanical connection between the lower surface terminals 110 and the group of the contact pads 104 on the upper surface on the first device carrier 102 may be effectuated by regions of a conductive intermediary material 114. The conductive intermediary material 114 may be any electrical interconnection material such as solder, sinter, glue, etc.

According to an embodiment, the semiconductor device package 108 is an embedded package. In contrast to a molded package that comprises a monolithic region of mold compound encapsulating a semiconductor die and lead frame, in an embedded package the encapsulant body is formed from multiple constituent layers of dielectric material that are laminated (stacked) on top of one another. The semiconductor die or dies of an embedded package are embedded within openings constituent laminate layers, and may be sealed by a resin. Each constituent laminate layer can comprise a rigid dielectric material that is suitable for semiconductor device encapsulation. Examples of these dielectric materials include epoxy materials, blended epoxy and glass fiber materials such as FR-4, FR-5, CEM-4, etc., and resin materials such as bismaleimide trazine (BT) resin. An embedded package may also include multiple layers of metallization, e.g., copper, aluminum, etc., and alloys thereof, formed on top of at least some of the constituent laminate layers. These layers of metallization can be structured to form internal electrical interconnects package body as well as the terminals 110 that are exposed at the outer surfaces of the package body. Conductive vias, e.g., vias comprising tungsten, copper, etc., may be provided in openings that extend through the constituent layers of dielectric material to provide vertical electrical interconnect. Due to the electrical interconnect provided by the internal structured metallization, an embedded package does not require a lead frame. Therefore, the semiconductor device package 108 may be devoid of a die pad that accommodates the semiconductor dies and/or devoid of conductive leads that are formed from the same lead frame structure as a die pad.

The semiconductor dies embedded within the package body of the semiconductor device package 108 can have a wide variety of device configurations, e.g., discrete device configurations such as a MOSFET, IGBT, diode, etc., integrated circuit configurations such as a controller, driver, etc. The semiconductor dies can comprise type IV semiconductor materials, e.g., as silicon, silicon germanium, silicon carbide, etc., and/or type III-V semiconductor materials, e.g., gallium nitride, gallium arsenide, etc. One or more of the semiconductor dies may be configured as a vertical device that is configured to control a current flowing between a main surface and an opposite facing rear surface, or a lateral device that is configured to control a current flowing parallel to a main surface. One or more of the semiconductor dies may be a power semiconductor die. A power semiconductor die refers to a component that is rated to accommodate voltages of at least 100V and more commonly on the order of 500V or more and/or currents of at least 1 A and more commonly on the order of 10 A or more. Discrete power semiconductor dies include MOSFETs (Metal Oxide Semiconductor Field Effect Transistors), IGBTs (Insulated Gate Bipolar Transistors), and HEMTs (High Electron Mobility Transistors), for example.

According to an embodiment, the semiconductor device package 108 is configured as a power module. This type of device comprises power switching devices (e.g., MOSFETs, IGBTs, HEMTs) and a driver die that controls a switching operation of these power switching devices. Thus, the semiconductor device package 108 may comprise two power transistor dies that are configured as power switching devices and form a half-bridge circuit with a high-side switch and low-side switch connected in series with one another and a third semiconductor die that is configured as a driver device (e.g., a CMOS logic device) that is configured to control a switching operation of the high-side switch and low-side switch.

The semiconductor assembly 100 further comprises a discrete passive element 112 comprising a main body 116 and a pair of leads 120 exposed from the main body 116. The discrete passive element 112 can be any device that provides a defined electrical impedance e.g., resistance, capacitance, inductance, between the pair of leads 120. According to an embodiment, the discrete passive element 112 is configured as an inductor. This inductor may be connected to an output terminal of the semiconductor device package 108. More particularly, the discrete passive element 112 that is an inductor may be connected in series with a switch node 'SW' of a half-bridge circuit from the semiconductor device package 108. The main body 116 of the discrete passive element 112 comprises an electrically insulating region of e.g., mold compound, resin, etc., that encapsulates the impedance element, e.g., inductance winding, capacitor plates, etc. The leads 120 may be leads 120 electrically conductive structures, e.g., metal structures comprising aluminum, copper, alloys thereof, etc., that protrude from the main body 116 and form the externally accessible terminals of the discrete passive element 112.

The discrete passive element 112 is mounted on the first device carrier 102 with the pair of leads 120 electrically connecting with contact surfaces on the first device carrier 102. The contact surfaces refer to the conductive structures of the first device carrier 102 that are adapted for electrical interconnection. In the depicted embodiment, the contact surfaces correspond to a pair of the contact pads 104 from the first device carrier 102 that are arranged on opposite sides of the semiconductor device package 108. In the case that the discrete passive element 112 is a discrete inductor that is connected in series with a switch node 'SW' of a half-bridge circuit from the semiconductor package, the first device carrier 102 may be arranged to provide an electrical connection between a first one of the leads 120 and a switch node 'SW' from the semiconductor device package 108, while the second one of the leads 120 is electrically connected to a contact pad from the second device carrier 102 via the first device carrier 102.

According to an embodiment, the semiconductor assembly 100 comprises a flowable electrical connection material 122 that is arranged between the leads 120 and the contact surfaces on the first device carrier 102. A flowable electrical connection material 122 refers to an electrically conductive material that can initially exist in a liquified or gelatinous state and subsequently hardened or cured into a solid state and mechanically stable, e.g., though an agent or external conditions such as temperature, pressure, etc. In addition to providing an electrical connection, the flowable electrical connection material 122 may provide a mechanically coupled connection between the connected elements. Examples of flowable electrical connection material 122 include solder materials, sinter, conductive glue, etc.

The semiconductor assembly 100 may further comprise additional passive elements 112 mounted on the device carrier 102 outside of the footprint of the semiconductor device package 108. The additional passive elements 112 can be any device that provides a defined electrical impedance. According to an embodiment, the additional passive elements 112 are discrete capacitor structures which also form part of the output circuit of the half-bridge circuit formed by the semiconductor package.

The semiconductor assembly 100 comprises a region of gap filler material 124 arranged between a lower surface of the main body 116 of the discrete passive element 112 and the upper surface of the semiconductor device package 108. The gap filler material 124 may be any thermally conductive material that forms a stable heat transfer medium. The gap filler may be curable, e.g., through atmospheric conditions or an agent. Alternatively, the gap filler may remain in a quasi-solid or quasi-flowable state. In an embodiment, the region of gap filler material 124 comprises a silicone-based gap filer material. More particularly, the gap filler material 124 may comprise a silicone matrix with thermally conductive fillers comprising, e.g., BN (boron nitride), ZnO (zinc oxide), and $Al_2O_3$ (alumina). According to an embodiment, the region of gap filler material 124 comprises a so-called thermal interface material (TIM), which refers to a type of material used in electronics applications with high thermal conductivity in combination with low thermal conductivity. Alternatively, the region gap filler material 124 may comprise electrically conductive materials, including solder materials and conductive paste materials, if electrical isolation between the discrete passive element 112 and the semiconductor device package 108 is not necessary.

The region of gap filler material 124 thermally couples the semiconductor device package 108 to the discrete passive element 112. That is, the region of gap filler material 124 forms a thermal conduction path to transfer heat from the semiconductor device package 108 to the discrete passive element 112. The discrete passive element 112 thus may serve a dual role as both part of a power electronics circuit and as a heat sink. The heat dissipation capability of the discrete passive element 112 results from the fact that it contains a metal structure embedded within the metal main body 116. This metal structure may comprise internal lead portions and core element, e.g., inductor winding, within the main body 116. The metal structure therefore provides a thermal dissipation path to draw heat away from the semiconductor device package 108. According to an embodiment, an upper side of the discrete passive element 112 comprises an exposed metal that is connected within the metal structures inside of the main body 116, thus providing additional heat radiating capability.

Figure 2:
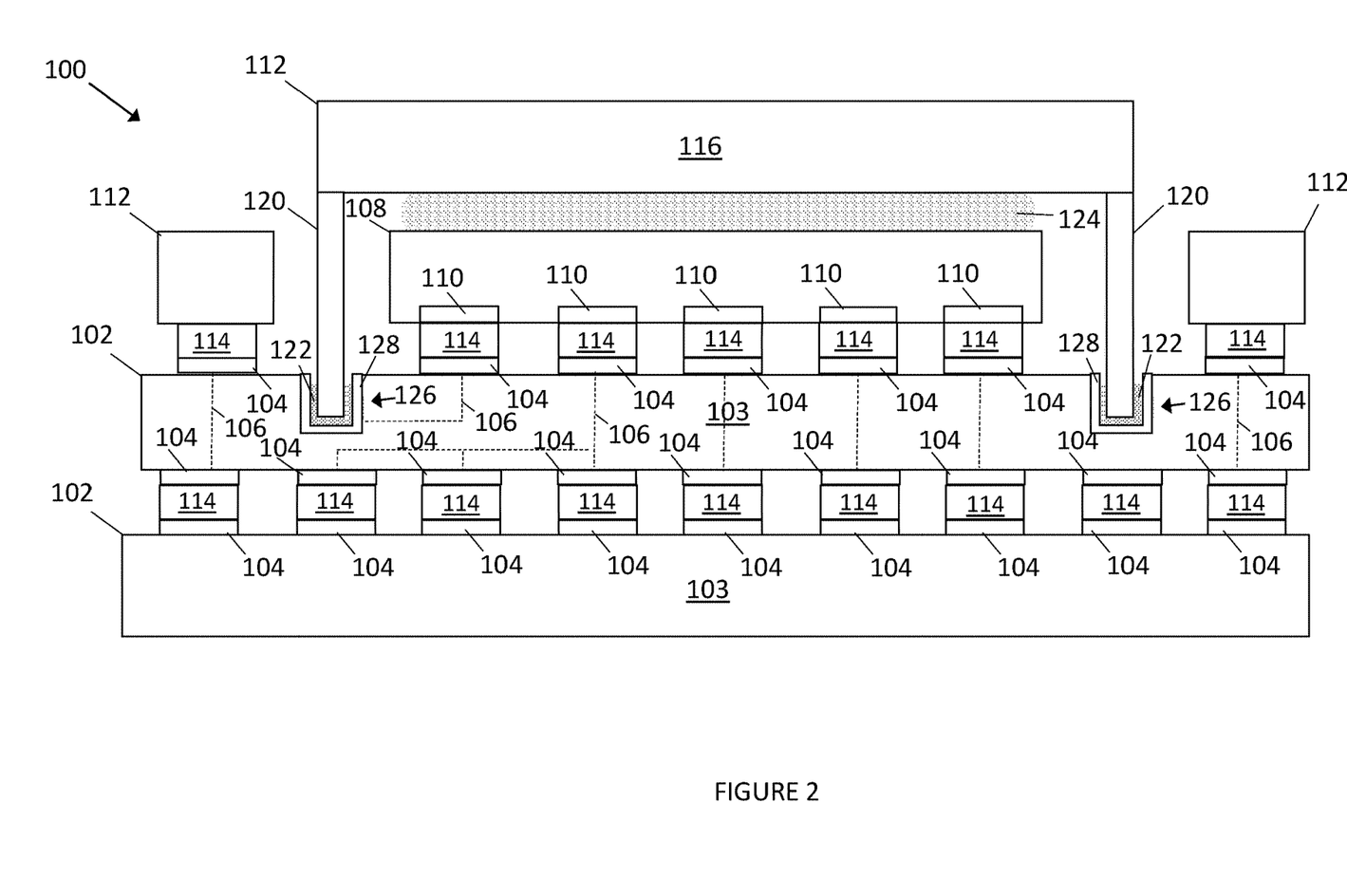
FIG. 2 illustrates a semiconductor assembly with a semiconductor device package and a discrete passive element mounted on a first device carrier that in turn is mounted on a second device carrier, wherein the first device carrier comprises contact trenches, according to an embodiment.

Referring to FIG. 2, in an embodiment the first device carrier 102 comprises a pair of contact trenches 126 that are arranged on opposite sides of the semiconductor device package 108. The contact trenches 126 extend from the upper surface of the first device carrier 102 into the dielectric substrate of the device carrier 102. The contact trenches 126 provide the contact surfaces of the first device carrier 102 that connect with the leads 120. That is, the contact trenches 126 replace the pair of pair of the contact pads 104 that are used to electrically connect with the leads 120 in the embodiment of FIG. 1. To this end, the bottoms and/or sidewalls of the contact trenches 126 comprise electrically conductive surfaces that are connected with the internal interconnect lines 106 of the first device carrier 102. The ends of the leads 120 can be electrically connected with these electrically conductive surfaces by a flowable electrical connection material 122 that is disposed within the pair of contact trenches 126. As shown, the pair of leads 120 can be arranged within the contact trenches 126 such that ends of both of the leads 120 are separated from the bottom surfaces of the contact trenches 126 by the flowable electrical connection material 122. That is, a region of the flowable electrical connection material 122 separates the leads 120 from the bottoms on the contact trenches 126.

According to an embodiment, the pair of contact trenches 126 each comprise a solderable plating 128 that lines a bottom surface and sidewall surfaces of the contact trenches 126. The term "solderable" as used herein means that a soldered joint can be made to that material. For example, the solderable plating 128 described herein may include any one or more of the following electrically conductive metals: Al, Cu, Ni, Sn, and Ag, wherein a soldered joint may be formed thereto. This solderable plating 128 may be used in combination with a flowable electrical connection material 122 that is a solder material to form an electrical connection between the pair of leads 120 and the solderable plating 128.

Figure 3:
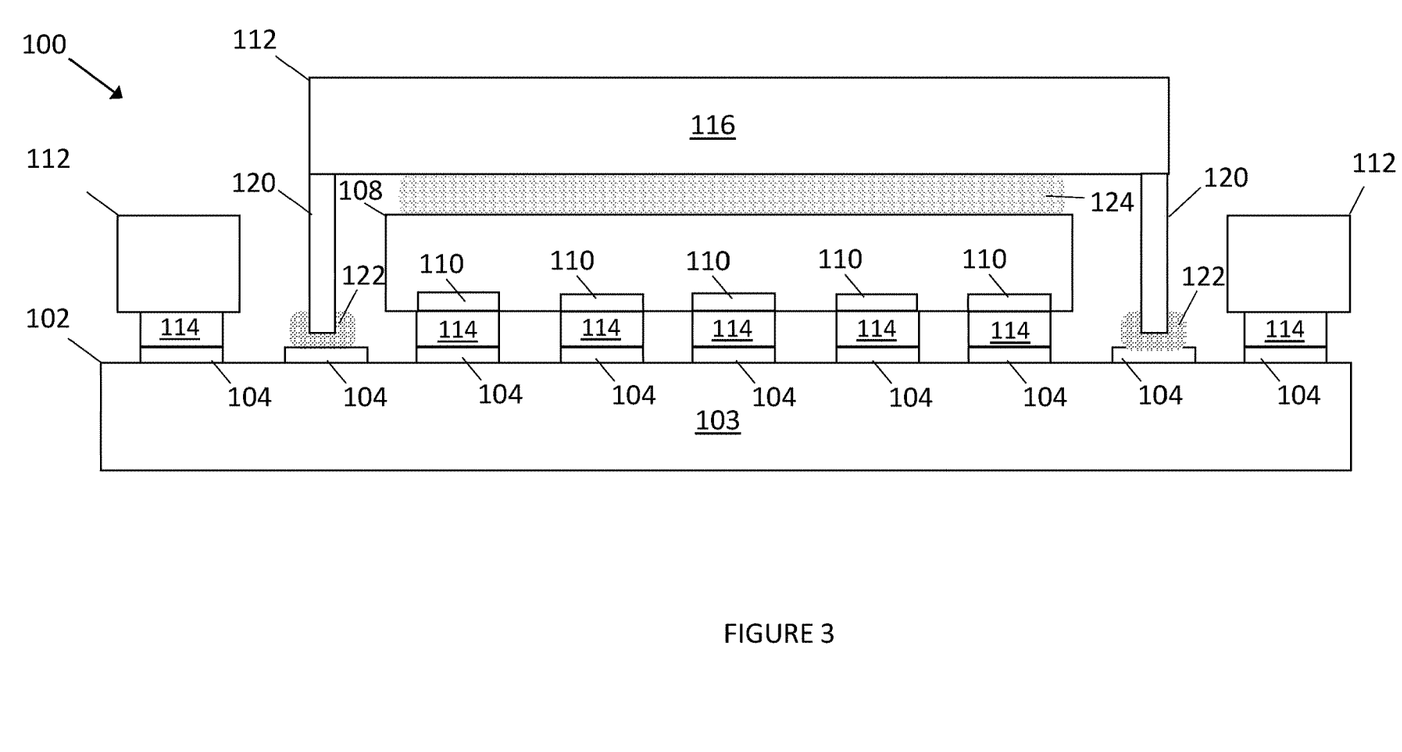
FIG. 3 illustrates a semiconductor assembly with a semiconductor device package and a discrete passive element mounted on a device carrier that may be a global circuit carrier, according to an embodiment.

Referring to FIG. 3, the semiconductor assembly 100 may be arranged without an interposer. In this case, the semiconductor device package 108 and the passive elements may be mounted directly on the contact pads 104 disposed on the upper surface of a device carrier 102 that is configured as a global circuit carrier, e.g., PCB, DCB, AMB, IMS, etc. that accommodates multiple additional electrical devices (not shown) mounted thereon. This global circuit carrier may comprise multiple groupings of the semiconductor device package 108 and the passive elements as shown in FIG. 3. Additionally, or alternatively, this global circuit carrier may comprise other elements, control circuits, sensors, passives, etc. In either case, the device carrier 102 may form electrical connections between the various elements mounted thereon by conductive tracks formed on or within the dielectric core region 103. In this embodiment, the contact pads 104 disposed on an upper surface of the device carrier 102 are arranged to mate with the lower surface terminals 110 of the semiconductor device package 108 and the passive elements 116 in similar manner as described above. In another embodiment, not shown, the semiconductor device package 108 that is configured as a global circuit carrier may comprise contact trenches 126 and the leads 120 from the discrete passive element 112 may be arranged within and electrically connected with these contract trenches in a similar manner as described above.

Figure 4:
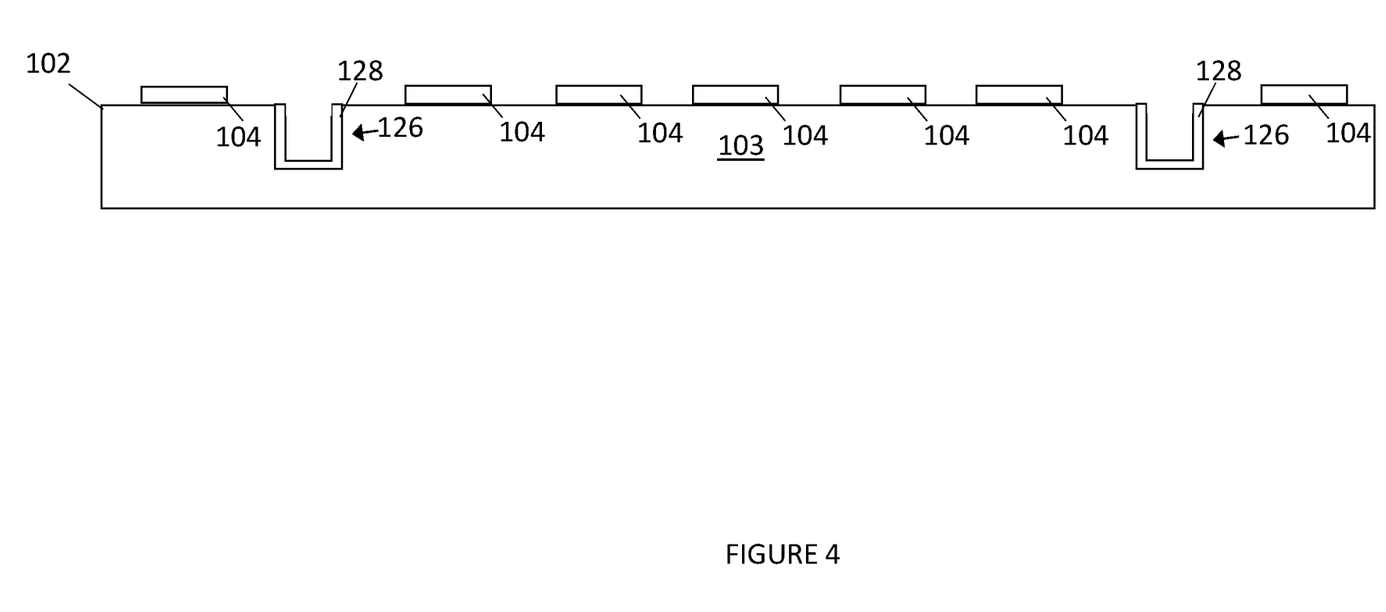
FIGS. 4-8 illustrate selected method steps for forming a semiconductor assembly with a semiconductor device package and a discrete passive element mounted on a device carrier, according to an embodiment.

Referring to FIG. 4, a method of forming the semiconductor assembly 100 comprises providing a device carrier 102. The device carrier 102 is provided with the dielectric core region 103 and the plurality of contact pads 104 disposed on an upper surface of the device carrier 102. In an embodiment wherein the device carrier 102 is configured as an interposer, the device carrier 102 may additionally comprise contact pads 104 disposed on a lower surface of the device carrier 102 and the internal interconnect lines 106 in the manner previously described (not shown in FIG. 4). In an embodiment wherein the device carrier 102 comprises the contact trenches 126, these contact trenches 126 can be created in several different ways. For instance, the device carrier 102 can initially comprise a substantially uniform thickness dielectric core region 103 and the contact trenches 126 can be formed by removing material, e.g., by etching, milling, drilling, etc., to a desired depth. Alternatively, the contact trenches 126 can be formed by the same process that constructs the device carrier 102. For instance, a lamination stacking technique which forms a plurality of constituent laminate layers may use constituent laminate with localized voids to form the trenches 126. In either case, the contact trenches 126 can initially be formed with the laminate material exposed and with a lower metallization and/or via structure reaching the sidewalls and/or bottom of the contact trenches 126. Subsequently, the conductive contact surfaces can be formed on the bottom and sidewalls of the contact trenches 126. According to an embodiment, a metal plating technique is used, e.g., electroplating or electroless plating to form the solderable plating 128 that lines the bottom surface and the sidewall surfaces of the contact trenches 126.

Figure 5:
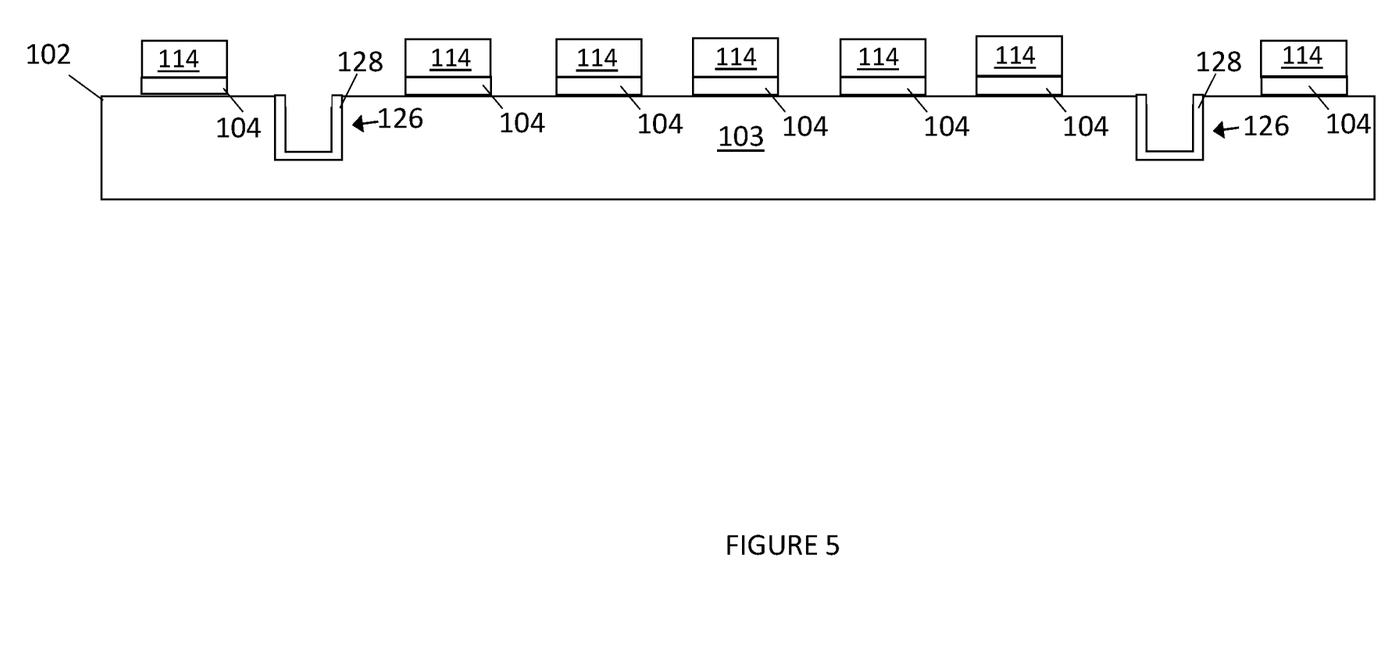

Referring to FIG. 5, the method further comprises providing the conductive intermediary material 114 on to the contact pads 104 disposed on the upper surface of the device carrier 102. This may comprise applying a solder material on each of the contact pads 104 disposed on the upper surface of the device carrier 102, e.g., using a screen-printing process.

Figure 6:
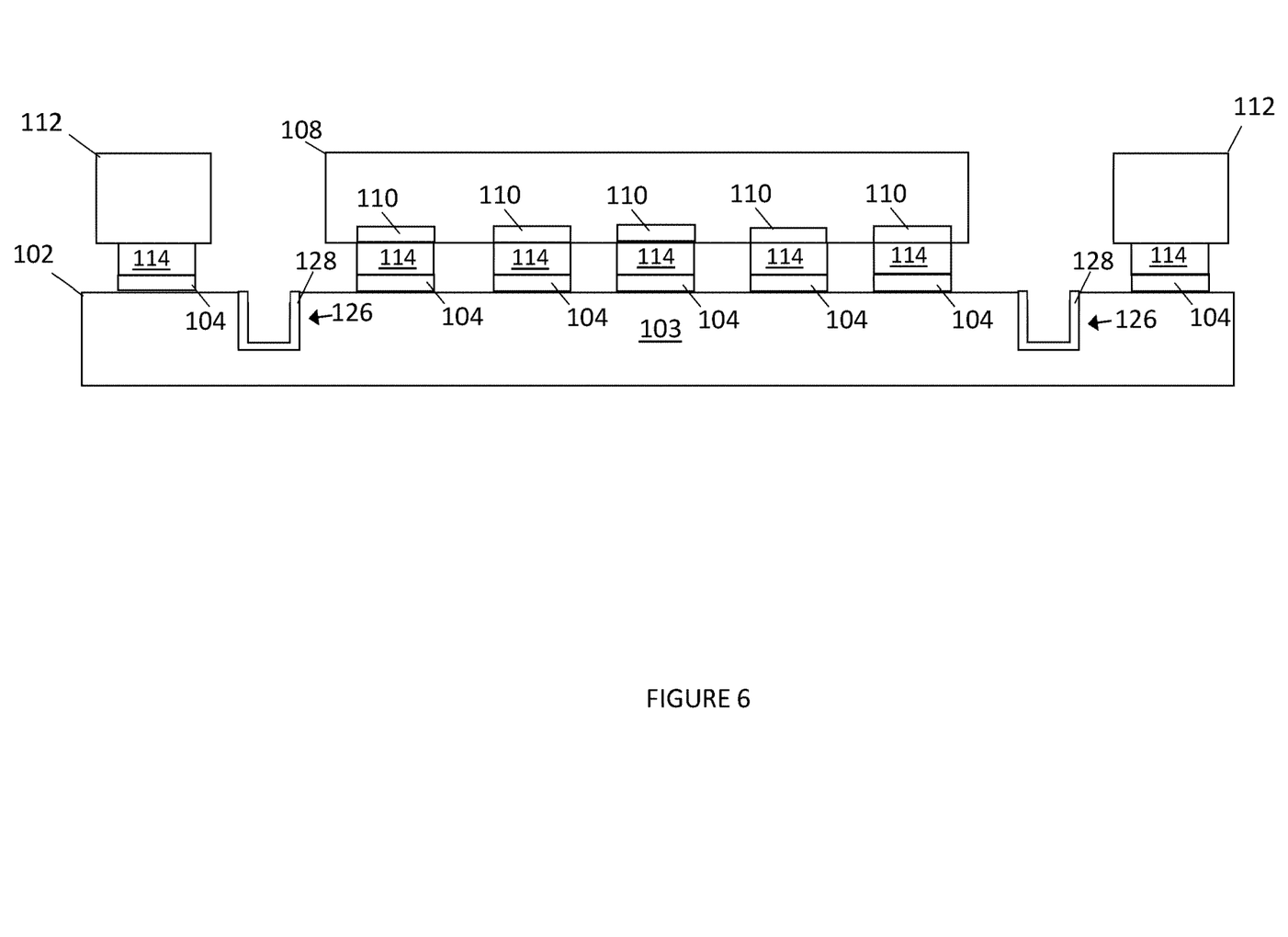

Referring to FIG. 6, the method further comprises attaching the lower device terminals 110 of the semiconductor device package 108 and the terminals of the additional passive elements 112 to the contact pads 104 disposed on the upper surface of the device carrier 102. A shown, the lower device terminals 110 and the terminals of the additional passive elements 112 are arranged on the conductive intermediary material 114. In the case of a solder material, a reflow process may be performed to form soldered joints.

Figure 7:
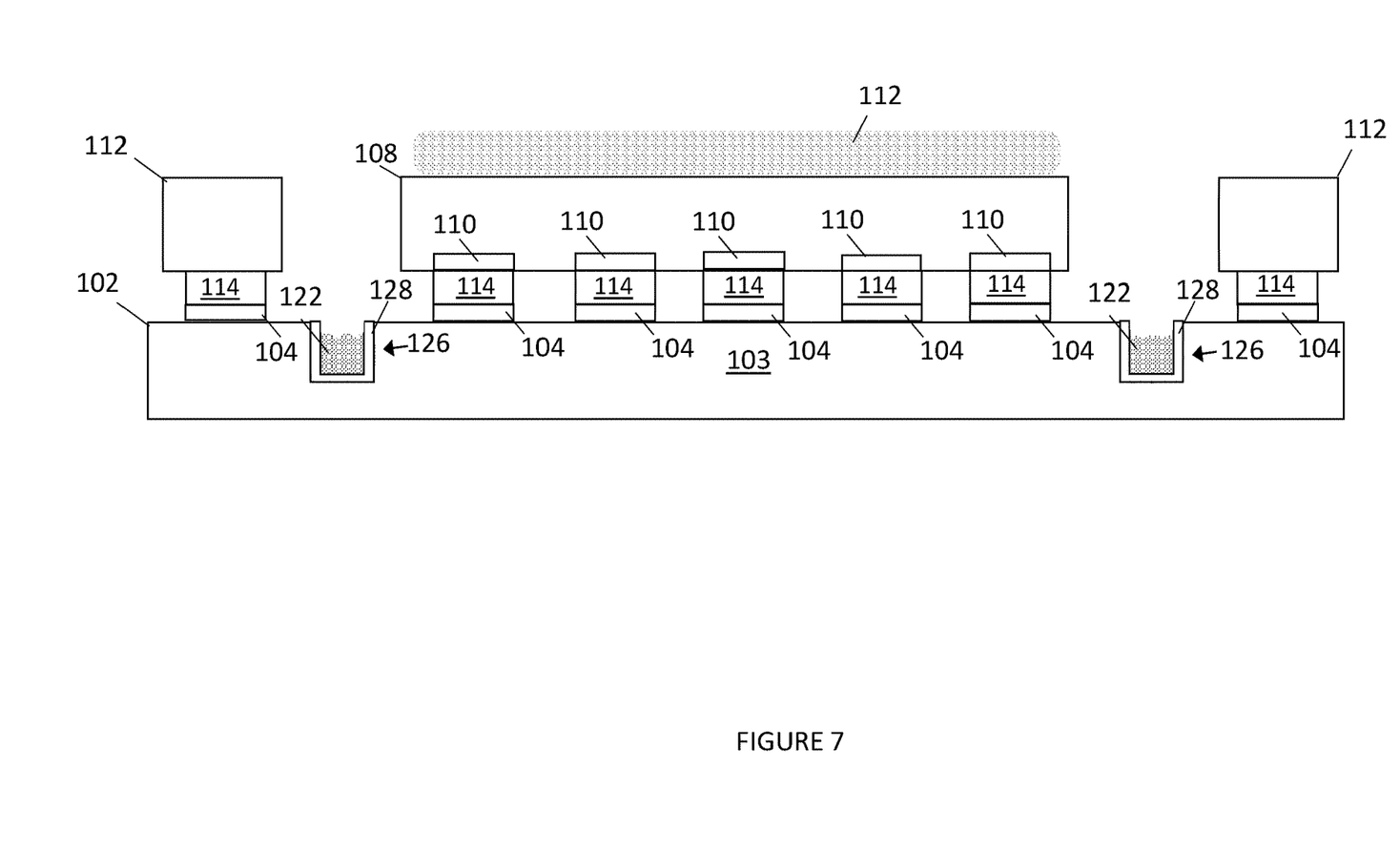

Referring to FIG. 7, the method further comprises providing the flowable electrical connection material 122 in the pair of contact trenches 126. The flowable electrical connection material 122 may be formed to partially of completely fill the contact trenches 126. The volume and/or depth of the flowable electrical connection material 122 may be selected to allow for adjustments to the insertion depth of the leads 120, to be discussed in further detail below. Additionally, the gap filler material 124 may be to the upper surface of the semiconductor device package 108. A thickness of the gap filler material 124 in this stage may generally be in the range of 100 μm to 500 μm.

Figure 8:
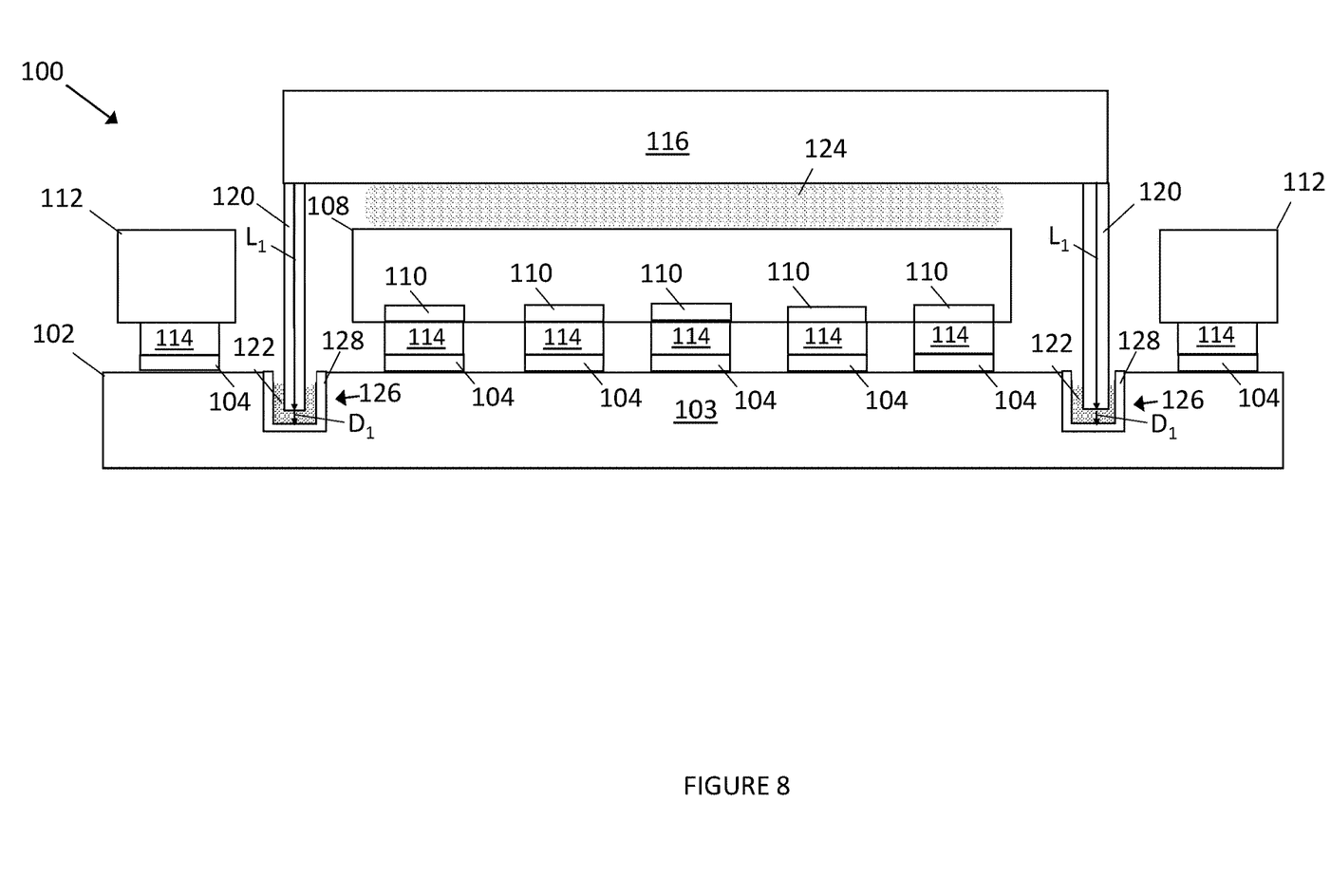

Referring to FIG. 8, the method further comprises inserting ends of the leads 120 from the discrete passive element 112 into the flowable electrical connection material 122 that is disposed within the contact trenches 126. The insertion process may be performed in such a way to obtain both a stable electrical and mechanical connection with the leads 120 as well as a level and uniform thickness volume of the thickness of the gap filler material 124. As the leads from the discrete passive element 112 are inserted, the lower side of the main body 116 presses against the gap filler material 124 and thus levels out any unevenness in the gap filler material 124. Preferably, the process is performed so that the gap filler material 124 material expands over a substantial percentage, e.g., at least 75%, 75%, 90% or more, of the area of the upper surface of the semiconductor device package 108. A thickness of the gap filler material 124 once flattened may be in the range of range of 100 μm to 200 μm to provide good thermal coupling in combination with adequate electrical isolation (if needed).

According to an embodiment, inserting the ends of the leads 120 into the contact trenches 126 comprises compensating for variations in the geometric parameters of the components which form the assembly. The components of the semiconductor assembly 100 including the device carrier 102, the discrete passive element 112 and the semiconductor device package 108 may have minor deviations in their geometry due to process variation. That is, as between a first assembly 100 and a second assembly 100 that are nominally identical to one another, the dimensions of these components, e.g., width, length, height, etc., may slightly deviate from a target value. This deviation may be due to a known and unavoidable process variation. Typically, parts are manufactured to conform to a particular standard, e.g., +/−1% deviation in thickness, length, etc, and all parts within this standard are considered passing. This known variation can create issues in the assembly process, particularly when multiple geometric deviations from target values are compounded. The contact trenches 126 with the flowable electrical connection material 122 advantageously provide a buffer margin to address this issue and ensure that the discrete passive element 112 is reliably mounted at the same standoff relative to the device carrier 102 and/or relative to the semiconductor device package 108.

According to an embodiment, the method comprises selecting an insertion depth for inserting the ends of the leads 120 in the flowable electrical connection material 122 to compensate for geometric variation of the components forming first and second ones of the semiconductor assemblies 100. That is, as between a first assembly 100 comprising each of the elements shown in FIG. 8, the distance Di between the ends of the leads 120 from the discrete passive element 112 and the bottom of the contact trenches 126 is different. This difference corresponds to a difference in the geometric parameters of the components which form the first and second assemblies 100. This technique can be used to ensure that the spacing between the main body 116 of the discrete passive element 112 and the semiconductor device package 108 is consistent as between the first and second assemblies 100. Consequently, the thickness of the gap filler material 124 can also remain constant at a preferred value, e.g., in the range of range of 100 μm to 200 μm. In a specific example of this technique, there may be a difference in length $L_1$ of the leads 120 of the discrete passive element 112 as between the first and second ones of the semiconductor assemblies 100, e.g., resulting from process variation. In that case, the manufacturing process of the first and second assemblies 100 may comprise altering an insertion depth of the leads 120 as between the first and second semiconductor assemblies 100 to compensate for the difference in length $L_1$ of the leads 120. Using numerical values for illustration purposes only, the length $L_1$ of the leads 120 of the discrete passive element 112 from a first assembly 100 may be about 5 μm greater than the length $L_1$ of the leads 120 of the discrete passive element 112 from a second assembly 100. In that case, the leads 120 from the first assembly may be inserted such that the distance Di is about 5 μm less in the first assembly 100 than in the second assembly 100, thereby providing a substantially identically standoff for the discrete passive element 112 of each assembly 100. A similar technique may be applied to account for other types of geometric variation, e.g., thickness of the semiconductor device package 108, standoff height of the semiconductor device package 108, thickness of the main body 116, etc. The compensation may be performed through actual measurement of the geometric parameters before insertion. Alternatively, the compensation may be performed without this knowledge and performing the mounting process to conform to a desired standard through in-situ measurement. The depth of the contact trenches 126 as measured between the upper surface of the device carrier 102 and bottom of the contact trenches 126 can be selected to account to for a maximum possible process deviation across all parameters to enable compensation. For example, the depth of the contact trenches 126 can be at least 50 μm, at least 100 μm, at least 150 μm, at least 200 μm.

Although the present disclosure is not so limited, the following numbered examples demonstrate one or more aspects of the disclosure.

Example 1. A semiconductor assembly, comprising: a device carrier that comprises a dielectric core region and a plurality of contact pads disposed on an upper surface of the device carrier; a semiconductor device package comprising a plurality of lower surface terminals, a discrete passive element comprising a main body and a pair of leads exposed from the main body; and a region of gap filler material, wherein the semiconductor device package is mounted on the device carrier with the lower surface terminals facing and electrically connected to a group of the contact pads, wherein the discrete passive element is mounted on the device carrier with the pair of leads electrically connecting with contact surfaces on the device carrier, and wherein the region of gap filler material is arranged between a lower surface of the main body and the upper surface of the semiconductor device package and thermally couples the semiconductor device package to the discrete passive element.

Example 2. The semiconductor assembly of example 1, wherein the semiconductor device package is an embedded package that comprises a power semiconductor die embedded within a laminate package body.

Example 3. The semiconductor assembly of example 2, wherein the discrete passive element is a discrete inductor.

Example 4. The semiconductor assembly of example 1, wherein the pair of leads is electrically connected to a pair of the contact pads that are arranged on opposite sides of the semiconductor device package.

Example 5. The semiconductor assembly of example 1, wherein the device carrier comprises a pair of contact trenches that are arranged on opposite sides of the semiconductor device package, wherein the pair of contact trenches each comprise a solderable plating that lines a bottom surface and sidewall surfaces of the contact trenches, and wherein the pair of leads is electrically connected to the solderable plating from the pair of contact trenches.

Example 6. The semiconductor assembly of example 5, further comprising a flowable electrical connection material disposed within the pair of contact trenches, and wherein the pair of leads is arranged within the contact trenches such that ends of both of the leads are separated from the bottom surfaces of the contact trenches by the flowable electrical connection material.

Example 7. The semiconductor assembly of example 1, further comprising a second device carrier that comprises a dielectric core region and a plurality of contact pads disposed on an upper surface of the second device carrier, wherein the device carrier is mounted on the second device carrier, and wherein the device carrier is an interposer comprising contact pads disposed on a lower surface of the device carrier, and wherein the device carrier electrically connects one or more of the lower surface terminals of the semiconductor device package to the contact pads disposed on the upper surface of the second device carrier.

Example 8. The semiconductor assembly of example 1, wherein the device carrier is a printed circuit board with a plurality of electrical devices mounted thereon.

Example 9. The semiconductor assembly of example 1, wherein the gap filler material is a thermal interface material.

Example 10. A semiconductor assembly, comprising: a device carrier that comprises a dielectric core region and a plurality of contact pads disposed on an upper surface of the device carrier; a semiconductor device package comprising a plurality of lower surface terminals; and a discrete passive element comprising a main body and a pair of leads exposed from the main body, wherein the discrete passive element is mounted over the semiconductor device package with a lower surface of the main body facing an upper surface of the semiconductor device package, wherein the device carrier comprises a pair of contact trenches that are arranged on opposite sides of the semiconductor device package, wherein the contact trenches comprise conductive contact surfaces on a bottom or sidewalls of the contact trenches, and wherein the leads of the discrete passive element conductively contact the contact surfaces of the contact trenches.

Example 11. The semiconductor assembly of example 10, further comprising a flowable electrical connection material arranged within the contact trenches, and wherein the flowable electrical connection material vertically separates ends of the leads from the bottom of the contact trenches.

Example 12. The semiconductor assembly of example 11, further comprising a region of gap filler material arranged between the lower surface of the main body and the upper surface of the semiconductor device package, wherein gap filler material thermally couples the semiconductor device package to the discrete passive element.

Example 13. The semiconductor assembly of example 10, wherein the discrete passive element is a discrete inductor that is connected to an output of the semiconductor device package.

Example 14. A method of forming a semiconductor assembly, wherein forming the semiconductor assembly comprises: providing a device carrier that comprises a dielectric core region and a plurality of contact pads disposed on an upper surface of the device carrier; providing a semiconductor device package comprising a plurality of lower surface terminals; mounting the semiconductor device package on the device carrier with the lower surface terminals facing and electrically connected to a group of the contact pads; providing a discrete passive element comprising a main body and leads exposed from the main body; mounting the discrete passive element on the device carrier such that the leads electrically contact the device carrier and such that a lower surface of the main body faces an upper surface of the semiconductor device package; and providing a gap filler material in between the lower surface of the main body and the upper surface of the semiconductor device package such that the gap filler material thermally couples the semiconductor device package to the discrete passive element.

Example 15. The method of example 14, wherein the device carrier comprises a pair of contact trenches that are arranged on opposite sides of the semiconductor device package, wherein the pair of contact trenches each comprise a solderable plating that lines a bottom surface and sidewall surfaces of the contact trenches, and wherein the pair of leads is electrically connected to the solderable plating from the pair of contact trenches.

Example 16. The method of example 15, wherein mounting the discrete passive element on the device carrier comprises providing a flowable electrical connection material in the pair of contact trenches and inserting ends of the leads in the flowable electrical connection material.

Example 17. The method of example 16, composing forming first and second ones of the semiconductor assemblies each according to the method of example 16, wherein the method comprises selecting an insertion depth for inserting the ends of the leads in the flowable electrical connection material to compensate for geometric variation of the components forming the first and second ones of the semiconductor assemblies.

Example 18. The method of example 17, wherein the geometric variation comprises a difference in length of the leads of the discrete passive element from the first and second ones of the semiconductor assemblies.

Example 19. The method of example 18, wherein inserting the ends of the leads in the flowable electrical connection material comprises altering an insertion depth of the leads as between the first and second ones of the semiconductor assemblies to compensate for the difference in length of the leads.

Example 20. The method of example 16, wherein compensating for the geometric variation of the components comprises selecting the insertion depth such that a vertical separation distance between the lower surface of the main body and the upper surface of the semiconductor device package as between the first and second ones of the semiconductor assemblies is substantially identical.

The term "electrical connection" as used herein describes a low resistance electrical conduction path provided by one or more electrically conductive structures. An "electrical connection" may comprise multiple different electrically conductive structures such as bond pads, solder structures and interconnect lines.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor assembly, comprising:
a device carrier that comprises a dielectric core region and a plurality of contact pads disposed on an upper surface of the device carrier;
a semiconductor device package comprising a plurality of lower surface terminals,
a discrete passive element comprising a main body and a pair of leads exposed from the main body; and
a region of gap filler material,
wherein the semiconductor device package is mounted on the device carrier with the lower surface terminals facing and electrically connected to a group of the contact pads, wherein the discrete passive element is mounted on the device carrier with the pair of leads electrically connecting with contact surfaces on the device carrier, and wherein the region of gap filler material is arranged between a lower surface of the main body and the upper surface of the semiconductor device package and thermally couples the semiconductor device package to the discrete passive element.

2. The semiconductor assembly of claim 1, wherein the semiconductor device package is an embedded package that comprises a power semiconductor die embedded within a laminate package body.

3. The semiconductor assembly of claim 2, wherein the discrete passive element is a discrete inductor.

4. The semiconductor assembly of claim 1, wherein the pair of leads is electrically connected to a pair of the contact pads that are arranged on opposite sides of the semiconductor device package.

5. The semiconductor assembly of claim 1, wherein the device carrier comprises a pair of contact trenches that are arranged on opposite sides of the semiconductor device package, wherein the pair of contact trenches each comprise a solderable plating that lines a bottom surface and sidewall surfaces of the contact trenches, and wherein the pair of leads is electrically connected to the solderable plating from the pair of contact trenches.

6. The semiconductor assembly of claim 5, further comprising a flowable electrical connection material disposed within the pair of contact trenches, and wherein the pair of leads is arranged within the contact trenches such that ends of both of the leads are separated from the bottom surfaces of the contact trenches by the flowable electrical connection material.

7. The semiconductor assembly of claim 1, further comprising a second device carrier that comprises a dielectric core region and a plurality of contact pads disposed on an upper surface of the second device carrier, wherein the device carrier is mounted on the second device carrier, and wherein the device carrier is an interposer comprising contact pads disposed on a lower surface of the device carrier, and wherein the device carrier electrically connects one or more of the lower surface terminals of the semiconductor device package to the contact pads disposed on the upper surface of the second device carrier.

8. The semiconductor assembly of claim 1, wherein the device carrier is a printed circuit board with a plurality of electrical devices mounted thereon.

9. The semiconductor assembly of claim 1, wherein the gap filler material is a thermal interface material.

* * * * *